United States Patent
Shimizu

(10) Patent No.: US 7,346,837 B2
(45) Date of Patent: Mar. 18, 2008

(54) RELATIVE POSITION AND/OR POSTURE MEASURING SYSTEM FOR MEASURING RELATIVE POSITIONS AND/OR RELATIVE POSTURES USING A MAGNETIC FIELD GENERATOR AND A MAGNETIC FIELD DETECTOR

(75) Inventor: Masao Shimizu, Kanagawa (JP)

(73) Assignee: Sony Computer Entertainment Inc., Tokyo (JP)

( * ) Notice: Subject to any disclaimer, the term of this patent is extended or adjusted under 35 U.S.C. 154(b) by 491 days.

(21) Appl. No.: 11/075,028

(22) Filed: Mar. 7, 2005

(65) Prior Publication Data
US 2005/0200351 A1   Sep. 15, 2005

(30) Foreign Application Priority Data
Mar. 9, 2004   (JP) .............................. 2004-065531

(51) Int. Cl.
*H03M 13/00* (2006.01)
(52) U.S. Cl. .................. 714/799; 714/819; 324/207.15
(58) Field of Classification Search ............... 714/799, 714/819; 324/207.15
See application file for complete search history.

(56) References Cited

U.S. PATENT DOCUMENTS

| 4,017,858 | A | | 4/1977 | Kuipers | |
|---|---|---|---|---|---|
| 4,631,519 | A | * | 12/1986 | Johnston | 341/13 |
| 5,408,176 | A | * | 4/1995 | Blatt | 324/107 |
| 7,079,591 | B2 | * | 7/2006 | Fling et al. | 375/316 |

* cited by examiner

*Primary Examiner*—Shelly Chase
*Assistant Examiner*—Esaw Abraham
(74) *Attorney, Agent, or Firm*—Katten Muchin Rosenman LLP

(57) ABSTRACT

The present invention provides a relative position and/or posture measuring system for measuring relative positions and relative postures between a magnetic field generator and a magnetic field detector by detecting a change in a magnetic field, in which the magnetic field generator includes a clock generator, a plurality of M-sequential code generators, a plurality of spread code generators, a plurality of integrators, and a voltage to current converter, and transmission coils TX, TY, TZ generate magnetic fields according to driving currents based on spread code obtained by converting code sequences generated by the M-sequential code generators to spread code with the spread code generators. The magnetic field detector reversely spreads received magnetic field detection values to obtain a magnetic field amplitude, and computes relative positions and relative postures of the two from the magnetic field amplitude.

3 Claims, 2 Drawing Sheets

RELATIVE POSITION AND/OR POSTURE MEASURING SYSTEM FOR MEASURING RELATIVE POSITIONS AND/OR RELATIVE POSTURES USING A MAGNETIC FIELD GENERATOR AND A MAGNETIC FIELD DETECTOR

CROSS REFERENCE TO RELATED APPLICATIONS

This application claims priority to Japanese patent application number JP2004-065531, which application is hereby incorporated by reference.

BACKGROUND OF THE INVENTION

1. Field of the Invention

The present invention relates to a relative position and/or posture measuring system including a magnetic field generator including a plurality of transmission coils arrayed orthogonal to each other for transmitting a magnetic signal from each transmission coil, a magnetic field detector for receiving a magnetic field generated in each transmission coil as a magnetic field detection value for each transmission coil, and a computing unit for computing a relative distance and a relative posture between the magnetic field generator and the magnetic field detector based on the magnetic field detection value for each transmission coil received by the magnetic field detector.

2. Description of Related Art

There has been known the Polhemus sensor using a magnetic sensor as a system for measuring a space position of an object to be measured or a posture thereof in the measuring step.

This polhemus sensor is a system for grasping a space position of an object to be measured and a posture thereof defined by the Euler angle by positioning a magnetic field generator including three transmission coils orthogonal to each other at an origin of a measurement space, also providing a magnetic field detector including three receiving coils orthogonal to each other corresponding to the three transmission coils respectively, detecting a magnetic field generated when a driving current is loaded to the transmission coils with the receiving coils, and processing the detected magnetic field with a computing unit.

More specifically, a driving current is loaded to the three transmission coils in the time division mode to drive the transmission coils sequentially, three magnetic fields received by the receiving coils when each transmission coil is being driven are detected, and a simultaneous equation is set based on totally 9 signal values to compute X-, Y-, Z-axial positions of an object to be measured, a pitch, yaw, and roll angles of the object to be measured (Refer to, for instance, Reference: U.S. Pat. No. 4,017,858, specification, column 10 to column 12, FIG. 10 and FIG. 11).

With the polhemus sensor as described above, not only a three-dimensional space position of an object to be measured, but a posture thereof at the time point can be grasped, and therefore by attaching the polhemus sensor to a head-mount display unit connected to a computer, and when an operator puts on this head-mount display unit, a screen to be displayed on the head-mount display can be changed in response to movements of the operator such as looking back or moving forward or backward, and thus utilization of the polhemus sensor as a position measuring system in virtual reality is highly expected.

The polhemus sensor as disclosed in the Reference has, however, the following problems.

In other words, generation of a magnetic field by each transmission coil is carried out in the time division mode, a long period of time is required for detecting a position and a posture of an object to be measured, and the rate action is disadvantageously delayed.

Further, the communication system using a carrier wave as it is employed, so that the system is weak to noises, and detection of a position is possible within a short distance, and therefore the communication system can not practically be applied as a position measuring system in the virtual reality. Especially, when the number of channel is increased for more accurately computing a state of the object to be measured, influence by noises becomes disadvantageously larger.

SUMMARY OF THE INVENTION

An object of the present invention is to provide a relative position and/or posture measuring system little affected by noises, capable of executing a quick rate action and being fully endurable in practical use for measurement of a position and a posture of an object in virtual reality.

To achieve the object described above, the present invention provides a relative position and/or posture measuring system little affected by noises and capable of executing a quick rate action by employing an M-sequential demodulation system for measuring a relative position and a posture between two objects using a magnetic field amplitude.

More specifically, the relative position and/or posture measuring system according to the present invention includes a magnetic field generator including a plurality of transmission coils arrayed orthogonal to each other for transmitting a magnetic signal from each transmission coil; a magnetic field detector for receiving a magnetic field generated in each transmission coil as a magnetic field detection value for each transmission coil; and a computing unit for computing a distance and a relative posture between the magnetic field generator and the magnetic field detector based on the magnetic field detection value for each transmission coil received by the magnetic field detector, and the magnetic field generator includes a clock generator for generating a clock signal with a 50% duty cycle; a plurality of M-sequential code generator for generating code sequences different from each other from the clock signal given by the clock generator in the magnetic field detector side; a plurality of spread code generators each for converting each code sequence to spread code by computing an exclusive logical sum of a code sequence generated by each M-sequential code generator or a clock signal generated by the clock generator; a plurality of integrators each for generating a waveform obtained by integrating each spread code generated by each spread code generator; and a voltage to current converter each for converting the waveform generated by each integrator to a voltage waveform and giving a driving current to each transmission coil by means of voltage to current conversion, while the computing unit computes a distance between and relative postures of the magnetic field generator and the magnetic field detector based on an amplitude of a magnetic field detection value obtained by reverse spreading with spread code corresponding to the detected magnetic field detection value for each transmission coil.

By computing the exclusive logical sum of the code sequence generated by the M-sequential code generator and the clock signal with 50% duty cycle generated by the clock generator, even when the generated code sequence include a sequence of the same figures such as 0,0,0 . . . or 1,1,1 . . . , the code sequence is converted to that based on a combination of 0 and 1 according to the clock signal, and therefore an integrated value of the code sequence never diverge to an extremely enormous value, so that a current value with an appropriate waveform can be given to each transmission coil by the integrator.

In the present invention, the integrator is provided, because, when a magnetic field generated from the transmission coil is detected by the magnetic field detector, the magnetic field is detected as a change in the magnetic flux density per unit period of time, and therefore by previously integrating an input value, the magnetic field detection value detected by the magnetic field detector is equivalent to a value obtained by differentiating the value with respect to time, so that the obtained value can directly be compared to the input value before integration in the magnetic field detector.

With the present invention, by converting different code sequences generated by the M-sequential code generator to spread code and also by generating a driving current for each transmission coil based on a voltage waveform obtained by integrating the spread code, the magnetic field detector can detect a magnetic field detection value as a change in the magnetic flux density when a change occurs in relative positions between and relative postures of the magnetic field generator and the magnetic field detector. Therefore, by reversely spreading the magnetic field detection value with the computing unit, the state prior to integration by the integrator can be detected, so that the relative positions between and relative postures of the magnetic field generator and the magnetic field detector can be computed.

Further, by employing the M-sequential demodulation system as the modulation system, the magnetic field detector can discretely identify and separate each of the magnetic fields generated by the transmission coils, and therefore it is not necessary to output a magnetic field detection value from each transmission coil in the time division mode, and an excellent response and further wideband spreading is executed, so that it is possible to measure relative positions between and relative postures of the two without being affected by noises even when the distance between the magnetic field generator and the magnetic field detector is large.

Further, as the M-sequential demodulation system is employed, the magnetic field detector can generate spread code and synchronize independently from the magnetic field generator, so that the spread code generated by the magnetic field generator is not transmitted to the magnetic field detector by means of, for instance, a communication system, and therefore wireless system can also be available.

In the relative position and/or posture measuring system according to the present invention, the magnetic field detector includes a plurality of receiving coils corresponding to a plurality of transmission coils, and the computing unit preferably reversely spreads the magnetic field detection values detected by the receiving coils according to the spread code to obtain magnetic field amplitude values each obtained by multiplying the number of receiving coils by the number of transmission coils and generates a simultaneous equation from the magnetic field amplitude values, and then computes a distance between relative postures of the magnetic field generator and the magnetic field detection.

In a case, for instance, where there are two transmission coils and two receiving coils, each receiving coil receives outputs from the two transmission coils, so that four simultaneous equations can be generated.

In a case, for instance, where there are three transmission coils and three receiving coils, each of the receiving coils receives outputs from the three transmission coils, so that nine simultaneous equations can be generated by the computing unit When the computing unit generates four simultaneous equations and analyzes the simultaneous equations, relative position coordinate information between the two on the X-Y two-dimensional plane can be obtained.

When the computing unit generates 9 simultaneous equations and analyzes the equations, in addition to the relative position coordinate information for the two in the X, Y, Z three-dimensional space, relative posture information defined by Euler angles can be obtained.

With the invention, the polhemus sensor can be used as it is to enjoy the advantages of the present invention.

In the relative position and/or posture measuring system according to the present invention, it is preferable that at least three or more transmission coils and receiving coils are provided respectively, each receiving coil detects at least three magnetic field detection values from the transmission coils, and also that the computing unit generates 9 or more simultaneous equations based on the at least 9 magnetic field detections to compute relative position coordinate information of the magnetic field generator and the magnetic field detector in the three-dimensional space and also relative posture information of the two defined by Euler angles.

With the present invention, 9 or more simultaneous equations can be generated with at least three transmission coils and at least three receiving coils, and also the relative position coordinate information and relative posture information can be computed as described above, so that the present invention can advantageously be applied to a controller or a head-mount display used in a virtual reality games.

Further, by increasing the numbers of transmission coils and receiving coils, more magnetic field detection values can be obtained, so that the number of simultaneous equation as targets for analysis increases, and therefore precisions of the relative positional coordinate information and relative posture information computed as described above can be improved.

DETAILED DESCRIPTION OF PREFERRED EMBODIMENT(S)

An embodiment of the present invention is described below with reference to the related drawings.

Figure 1:
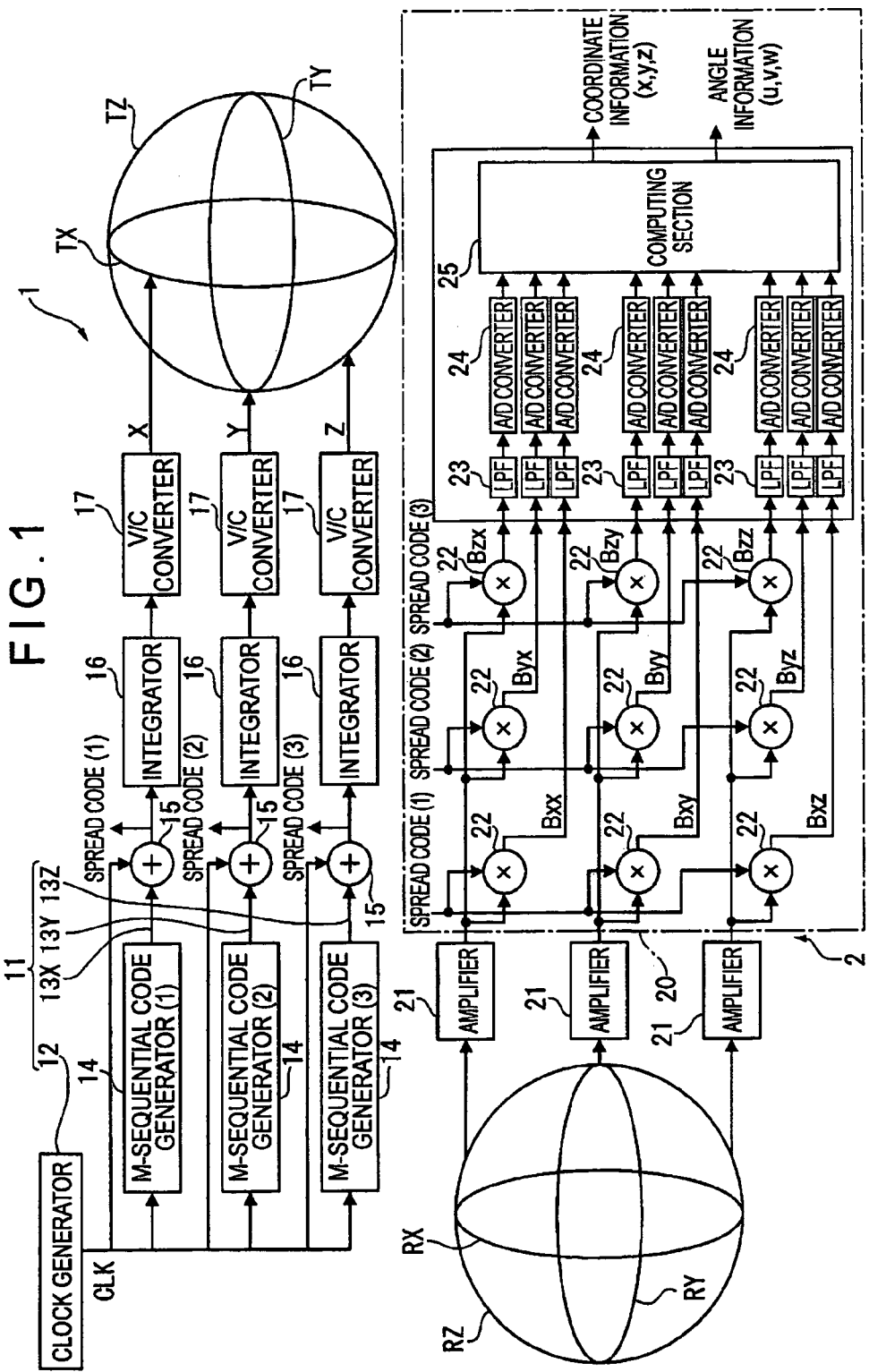
FIG. 1 is a block diagram showing a structure of a relative position and/or posture measuring system according to an embodiment of the present invention.

FIG. 1 shows a relative position and/or posture measuring system according to the embodiment of the present invention, and this relative position and/or posture measuring system includes a transmission side unit 1 as a magnetic field generator and a receiving side sensor unit 2 including a magnetic field detector.

The transmission side unit 1 includes three transmission coils TX, TY, TZ arranged orthogonal to the axis X, axis Y, and axis Z within a three-dimensional space and a unit body 11 giving a driving current to the transmission coils TX, TY, TZ.

Each of the transmission coils TX, TY, TZ generates a magnetic field by making use of electromagnetic induction, and includes a wire wound into a coil having a prespecified diameter with a prespecified number of turns, and for instance, a coil with the diameter of 90 mmΦ and 100 turns may be used. The transmission coils TX, TY, TZ are provided orthogonal to each other so that the directions of magnetic fields generated by the transmission coils are along the X-axial, Y-axial, and Z-axial directions.

The unit body 11 includes a clock generator 12 for generating a clock signal, and circuits 13X, 13Y, 13Z for generating driving currents to the transmission coils TX, TY, and TZ respectively.

The clock generator 12 generates a clock signal CLK with a 50% duty cycle, and the unit body 11 feeds driving currents to the transmission coils TX, TY, TZ based on the generated clock signal CLK.

Each of the circuits 13X, 13Y, 13Z includes an M-sequential code generator 14, a spread code generator 15, an integrator 16, and a voltage to current converter 17, and are arrayed in this sequence between the clock generator 12 and each of the transmission coils TX, TY, TZ.

The M-sequential code generator 14 generates a prespecified code sequence from the clock signal CLK given from the clock generator 12, and includes an N-stage shift register, and a logic circuit for feeding back the logical merge in the stage N to an input of the shift register, and the longest cycle L in the stage N is $2^N-1$ bits ($L=2^N-1$).

The M-sequential code generators 14 constituting the circuits 13X, 13Y, 13Z generates code sequences different from each other respectively, and because of this feature, driving currents each having a different waveform are fed to the transmission coils TX, TY, and TZ. The code sequence used in this step should preferably have a large ratio of an autocorrelation value to a cross correlation value (suppression ratio).

The spread code generator 15 generates an exclusive logical sum of the code sequence generated by the M-sequential code generator 14 and the clock signal CLK generated by the clock generator 12 as spread code XOR.

Figure 2:
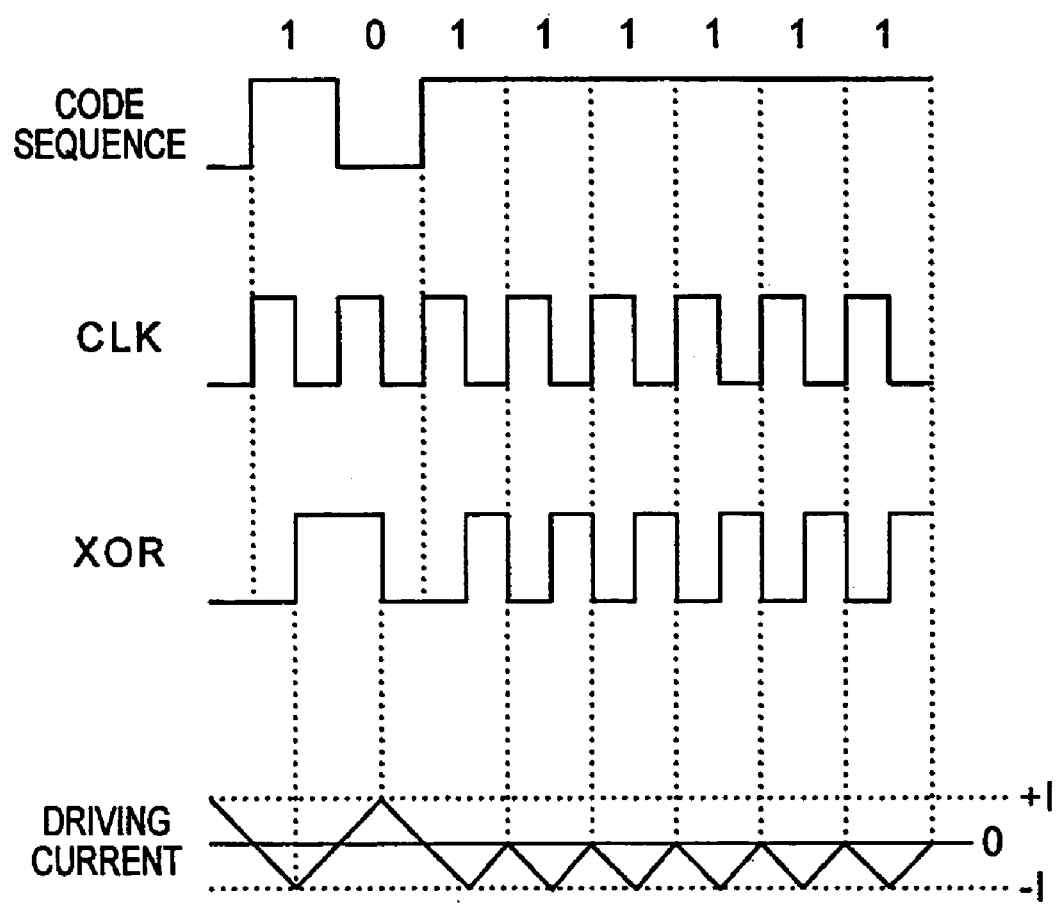
FIG. 2 is a schematic view for illustrating the principle of generation of spread code from a code sequence generated by an M-sequential code generator in the embodiment.

More specifically, as shown in FIG. 2, when an exclusive logical sum of the clock signal CLK with a 50% duty cycle is computed in relation to the code sequence generated by the M-sequential code generator 14, the exclusive logical sum is 0 for the clock of 1 and 1 for the clock of 0 when a value of the code sequence is 1. Similarly, when a value of the code sequence is 0, the exclusive logical sum is 0 for the clock CLK of 0 and 1 for the clock CLK of 1.

When the spread code generator 15 computes the exclusive logical sum of the code sequence generated by the M-sequential code generator 14 or the clock signal CLK generated by the clock generator 12, the output is spread code XOR with the value changing according to a cycle of the clock CLK even at the maximum as shown in FIG. 2. In other words, even when, for instance, the values of 1 repeating in a code sequence as observed in the later stage of the code sequence shown in FIG. 2, spread code XOR in which the values change with a prespecified cycle can be generated. The spread codes (1) to (3) converted by the circuits 13X, 13Y, 13Z are those obtained in the same manner by converting the code sequences generated by the M-sequential code generator 14 in the previous stage and different from each other, so that the spread codes (1) to (3) are naturally different from each other.

The integrator 16 integrates the spread code generated by the spread code generator 15, and includes an operational amplifier or the like.

This integrator 16 integrates the spread code XOR including a rectangular waveform as shown in FIG. 2 as an input, so that the triangular waveform as shown in FIG. 2 is output. A current having a waveform analogous to that of the rectangular waveform for the code sequence or spread code XOR is not suited to be supplied to the transmission coils TX, TY, TZ.

The voltage to current converter 17 executes voltage to current conversion using a waveform output from the integrator 16 as an input voltage and outputs driving currents to the transmission coils TX, TY, and TZ.

The driving currents output from this voltage to current converter 17 flow through the transmission coils TX, TY, TZ, and magnetic fields are generated by the currents flowing through the transmission coils TX, TY, TZ because of electromagnetic induction.

The receiving side sensor unit 2 detects the magnetic fields generated in the transmission side unit 1 described above and computes a distance between and relative postures of the transmission side unit 1 and the receiving side sensor unit 2 from the detected magnetic field values, and a result of computing is output to an electronic device such as a personal computer or a game device.

The receiving side sensor unit 2 includes three receiving coils RX, RY, RZ arranged orthogonal to the axis X, axis Y, and axis Z respectively within a three-dimensional space, a computing unit 20, and an amplifier 21 provided between each of the receiving coils RX, RY and RZ, and the computing unit 20, and the receiving coils RX, RY and RZ and the computing unit 20 correspond to the magnetic field detector according to the present invention.

The receiving coils RX, RY, and RZ each include, like the transmission coils TX, TY and TZ, a wire wound into a coil with a prespecified number of turns and function as a sensor body for detecting magnetic fields generated by the transmission coils TX, TY, and TZ. It is to be noted that the receiving coils RX, RY, and RZ each have a larger number of turns as compared to that of the transmission coils TX, TY, and TZ, and for instance, a coil with the diameter of 80 mmΦ and 200 turns may be used for this purpose.

When any change occurs in the relative positions and/or postures of the transmission side unit 1 and receiving side sensor unit 2, the magnetic flux density in each of the receiving coils RX, RY, and RZ changes.

The amplifier 21 amplifies a detected current generated in each of the receiving coils RX, RY, and RZ and outputs the amplified current to the computing unit 20.

The computing unit 20 computes a distance between and postures of the transmission side unit 1 and receiving side sensor unit 2 based on the detected current value indicating a magnetic field detection value amplified by the amplifier 21, and includes a reversely spreading processor 22, a low pass filter 23, an A/D converter 24, and a computing section 25.

The reversely spreading processor 22 multiplies the magnetic field detection value received by each of the receiving coils RX, RY, and RZ by the spread code XOR generated by the spread code generator 15 in the transmission side unit 1 to restore the original signal. The magnetic field detection value spread by the transmission side unit 1 can reversely be spread only according to the spread code generated by each spread code generator 15. In other words, when the spread code XOR generated by the circuit 13X in the transmission side unit 1 is used in this reversely spreading processor 22, only the magnetic field generated in the transmission coil TX can be reversely spread from the magnetic field detection value received by each of the receiving coils RX, RY, and RZ, and as the magnetic fields generated in the transmission coils TY, TZ have different spread codes, the spread state having no correlation is reserved.

As described above, by generating different code sequences by the M-sequential code generator 14 and inputting the different code sequences to selectively identify and separate a required signal from other signals, the magnetic field detection value can be obtained.

When the same spread code XOR as that used in the transmission side unit 1 is used in the receiving side sensor unit 2, the configuration is allowable in which the spread code XOR is transmitted from the transmission side unit 1 through a cable to the receiving side sensor unit 2, but with the configuration in which a clock generator, an M-sequential code generator, and a reversely spread code generator are provided in the receiving side sensor unit 2 like in the transmission side unit 1 to synchronize a clock of the transmission side unit 1 to that of the receiving side sensor unit 2 so that the initial value of the code sequence generated by the M-sequential code generator is identical, the spread code XOR can be generated by the receiving side sensor unit 2 without necessity of transmission from the transmission side unit 1.

With the configuration as described above, it is not necessary to connect the transmission side unit 1 to the receiving side sensor unit 2 with a cable or the like, and there is provided the advantage that this system can be used even through a radio communication system.

Noise components caused by high frequency waves are removed by the low pass filter 23 from the magnetic field detection value processed by the reversely spreading. processor 22 as described above, and further the magnetic field detection value is converted to a digital signal by the A/D converter 24 and input into the A/D converter 24.

The computing section 25 generates a simultaneous equation based on the input magnetic field detection value, and can compute a distance between and relative postures of the transmission side unit 1 and receiving side sensor unit 2 by computing through the simultaneous equation.

In this embodiment, there are three transmission coils TX, TY, TZ and three receiving coils RX, RY, RZ, so that the computing section 25 generates the following 9 equations with variables x indicating an X-axial coordinate, y indicating a Y-axial coordinate, z indicating a Z-axial coordinate, u indicating a pitch, v indicating a yaw, and w indicating a roll. Further, the Bij indicates a magnetic field detection value when a magnetic field generated by a transmission coil i is received by a receiving coil j:

$$f1(x,y,z,u,v,w)=Bxx$$

$$f2(x,y,z,u,v,w)=Bxy$$

$$\ldots$$

$$f9(x,y,z,u,v,w)=Bzz \quad \text{(Equation 1)}$$

Then, the computing section 25 computes x, y, z, u, v, w satisfying each equation based on the generated 9 simultaneous equations. For generating the simultaneous equation, the function described in the Reference described above is used, and any known method may be used for computing each value from the set function.

The obtained values of x, y, z, u, v, w are output to an electronic device such as a personal computer or a game device, while the electronic device grasps a distance between and relative postures of the transmission side unit 1 and receiving side sensor unit 2.

The relative position and/or posture measuring system as described above can conceivably be used in a game device, and for instance the use in the scene as described below is conceivable.

(a) A position and a posture of a head mount display worn by an operator against a game device can be grasped by the game device side, and a screen displayed on the game device side can be changed based on the grasped position and posture of the head mount display. In this case, it is preferable to provide the transmission side unit 1 in the head mount display side and also to provide the receiving side sensor unit 2 connected to the game device at a constant position for the purpose to input an output from the computing unit 20 into the game device.

(b) When the transmission side unit 1 is incorporated in a controller as an operation terminal for operating a game device and the receiving side sensor unit 2 is connected to the game device, not only by operating a button, a lever or the like of the controller, but also by only changing a posture of the controller, a screen can be displayed at the device side in accordance with the posture of the controller, so that reality in a game is further improved. Especially, when the controller is a gun controller (a gun type of controller), in order to set a sight, a point on which the sight is set can clearly be grasped with the system described above from a position and a posture of the gun controller.

(c) When one of the transmission side unit 1 or the receiving side sensor unit 2 is removably attached to or incorporated in a portable type of game device having a display screen with the other one of the receiving side sensor unit 2 or the transmission side unit 1 connected to the portable type of game device via a cable or the like and placed, for instance, on a floor or a desk, the game screen can be changed according to a position and a posture of the portable game device.

With the embodiment described above, the following advantages can be obtained.

(1) By converting different code sequences generated by the M-sequential code generator 14 to spread code XOR and generating driving currents of the transmission coils TX, TY, TZ based on voltage waveforms obtained by integrating the spread code XOR with the integrator 16, when a change occurs in a distance between or relative postures of the transmission side unit 1 and receiving side sensor unit 2, the receiving side sensor unit 2 can detect the magnetic field detection values each as a current value appearing as a change in the magnetic flux density. Therefore, by reversely spreading the current values with the reversely spreading processor 22 in the computing unit 20, values of the magnetic field amplitude generated by the transmission coils TX, TY, and TZ can discretely be detected, which further makes it possible to compute relative positions or postures of the two.

(2) As the M-sequential demodulation system is employed as the demodulation system, the receiving side sensor unit 2 can discretely identify magnetic fields generated by the transmission coils TX, TY, TZ respectively and separate each magnetic field from others, so that it is not necessary to output from the transmission coils in the time division mode and the system has an excellent response and is little affected by noises because of the wideband spreading. Therefore, even when a distance between the transmission side unit 1 and the receiving side sensor unit 2 is large, it is possible to accurately grasp relative positions and postures of the two units.

(3) As the M-sequential demodulation system is employed, the receiving side sensor unit 2 can generate spread code XOR independently from the transmission side unit 1 for synchronism, the transmission side unit 1 is not required to output spread code XOR generated thereby through a communication system or the like to the receiving side sensor unit 2, so that it is a wireless system may be available.

(4) As the system is formed with three transmission coils TX, TY, and TZ in the transmission side unit 1 and three receiving coils RX, RY, and RZ in the receiving sensor side unit 2, the computing unit 20 can compute not only a distance given as X-,Y-, Z-axial values, but also relative postures given as values for the pitch, yaw, and roll to accurately measure relative positions and postures of the transmission side unit 1 and receiving side sensor unit 2. Accordingly, when the measuring system according to this embodiment is applied to a head mount display or a controller for a game, the operator can enjoy a game with strong realistic sensations.

The present invention is not limited to the embodiment described above, and various modifications are allowable as long as the objects of the present invention can be achieved.

In the embodiment described above, the measuring system includes three transmission coils TX, TY, TZ and three receiving coils RX, RY, RZ, but the present invention is not limited to this configuration. In other words, three or more transmission coils and receiving coils may be employed, and the numbers of the transmission coils and receiving coils may not be identical.

In addition, the configuration with two transmission coils and two receiving coils are also included within a scope of the present invention, and this configuration can be applied to a case where, in a portable game device having a liquid crystal display unit, a display position for a game on the liquid crystal display unit is moved on the X-Y two-dimensional by moving the game device in parallel to the liquid crystal display unit forward and backward, or rightward and leftward.

In the embodiment described above, the receiving sensor unit 2 includes three receiving coils RX, RY, and RZ, but the present invention is not limited to this configuration, and a sensor unit based on any other detection method may be employed on the condition that magnetic fields generated by the transmission coils TX, TY, TZ can discretely be detected.

Specific configuration and arrangement in implementing the present invention may be designed in any manner as long as an object of the present invention can be achieved.

The priority application Number JP2004-065531 upon which this patent application is based is hereby incorporated by reference.

What is claimed is:

1. A relative position and/or posture measuring system comprising:
   a magnetic field generator including a plurality of transmission coils arrayed orthogonal to each other for generating a magnetic field from each transmission coil;
   a magnetic field detector for receiving the magnetic field generated in each transmission coil as a magnetic field detection value for each transmission coil; and
   a computing unit for computing a distance between and relative postures of the magnetic field generator and the magnetic field detector based on the magnetic field detection value for each transmission coil received by the magnetic field detector,
   wherein the magnetic field generator comprises a clock generator for generating a clock signal with a 50% duty cycle;
   a plurality of M-sequential code generators for generating code sequences different from each other from the clock signal given by the clock generator;
   a plurality of spread code generators each for converting each code sequence to spread code by computing an exclusive logical sum of a code sequence generated by each M-sequential code generator and a clock signal generated by the clock generator;
   a plurality of integrators each for generating a waveform obtained by integrating each spread code generated by each spread code generator; and
   a voltage to current converter for converting a waveform generated by each integrator to a voltage waveform and providing a driving current to each transmission coil by means of voltage to current conversion, and
   the computing unit computes the distance between the relative postures of the magnetic field generator and the magnetic field detector based on an amplitude of a magnetic field detection value obtained by reverse spreading of the spread code corresponding to the detected magnetic field detection value for each transmission coil.

2. The relative position and/or posture measuring system according to claim 1,
   wherein the magnetic field detector comprises a plurality of receiving coils corresponding to the plurality of transmission coils, and
   the computing unit reversely spreads the magnetic field detection values transmitted from each transmission coils and received by each receiving coils according to the spread code to obtain magnetic field amplitude values by the number obtained by multiplying the number of receiving coils by the number of transmission coils, and generates simultaneous equations from these magnetic amplitude values to compute the distance between and the relative postures between the magnetic field generator and the magnetic field detector.

3. The relative position and/or posture measuring system according to claim 2,
   wherein at least three or more transmission coils and receiving coils are provided respectively,
   each of the receiving coils detects at least three magnetic field detection values generated by the transmission coils, and
   the computing unit generates 9 or more simultaneous equations based on at least 9 or more magnetic field detection values to compute relative position coordinate information for the magnetic field generator and the magnetic field detector in a three-dimensional space as well as relative posture information of the magnetic field generator and the magnetic field detector defined by an Euler angle.

* * * * *